United States Patent
Noda

(10) Patent No.: US 7,141,477 B2
(45) Date of Patent: Nov. 28, 2006

(54) SEMICONDUCTOR DEVICE AND METHOD FOR FABRICATING THE SAME

(75) Inventor: Taiji Noda, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 14 days.

(21) Appl. No.: 10/676,877

(22) Filed: Oct. 2, 2003

(65) Prior Publication Data

US 2004/0072394 A1 Apr. 15, 2004

(30) Foreign Application Priority Data

Oct. 10, 2002 (JP) .............................. 2002-297513

(51) Int. Cl.
*H01L 21/336* (2006.01)

(52) U.S. Cl. ...................... 438/305; 438/303; 438/291; 438/289

(58) Field of Classification Search ................ 438/305, 438/306, 307, 303, 291, 289, 290
See application file for complete search history.

(56) References Cited

U.S. PATENT DOCUMENTS

| | | | | |
|---|---|---|---|---|
| 5,171,703 A | * | 12/1992 | Lin et al. ...................... | 438/198 |
| 6,184,112 B1 | * | 2/2001 | Maszara et al. ............. | 438/528 |
| 6,190,179 B1 | * | 2/2001 | Sundaresan ................. | 438/299 |
| 6,333,217 B1 | | 12/2001 | Umimoto et al. | |
| 6,368,928 B1 | * | 4/2002 | Wang et al. ................. | 438/307 |
| 6,432,802 B1 | | 8/2002 | Noda et al. | |
| 6,696,341 B1 | * | 2/2004 | Sonoda ........................ | 438/285 |
| 2001/0041432 A1 | * | 11/2001 | Lee ............................. | 438/530 |
| 2002/0058385 A1 | * | 5/2002 | Noda .......................... | 438/305 |

FOREIGN PATENT DOCUMENTS

JP 8-250729 9/1996

OTHER PUBLICATIONS

Noda et al., "Effects of end-of-rage dislocation loops on transient enhanced diffusion of indium implanted in silicon", Journal of Applied Physics, pp. 4980-4984, Nov. 1, 2000.
T. Noda, "Modeling of End-of Range (EOR) Defects for Indium Channel Engineering", Tech. Dig. IEDM, p. 839, 2001.
John, S et al.: "Strained Si n-channel metal-oxide-semiconductor transistor on relaxed Si1-xGex formed by ion implantation of Ge," Applied Physics Letters, American Institute of Physics, Apr. 5, 1999, vol. 74, No. 14, pp. 2076-2078.

* cited by examiner

*Primary Examiner*—Michael Trinh
(74) *Attorney, Agent, or Firm*—McDermott Will & Emery LLP

(57) ABSTRACT

Into a channel formation region of a semiconductor substrate of p-type silicon, indium ions are implanted at an implantation energy of about 70 keV and a dose of about $5\times10^{13}$/cm$^2$, thereby forming a p-doped channel layer. Next, germanium ions are implanted into the upper portion of the semiconductor substrate at an implantation energy of about 250 keV and a dose of about $1\times10^{16}$/cm$^2$, thereby forming an amorphous layer in a region of the semiconductor substrate deeper than the p-doped channel layer.

33 Claims, 15 Drawing Sheets

SEMICONDUCTOR DEVICE AND METHOD FOR FABRICATING THE SAME

BACKGROUND OF THE INVENTION

The present invention relates to MIS semiconductor devices capable of accomplishing a further miniaturization and operating with high speed and low power consumption, and to methods for fabricating the same.

With increasing packing density of a semiconductor device, MIS transistors in the device are requested to become miniaturized. To accomplish this request, a MIS transistor having a heavily-doped channel structure in which the dopant concentration of a channel region is made high is required (For example, Japanese Unexamined Patent Publication No. 08-250729).

Hereinafter, a conventional method for fabricating a MIS transistor will be described with reference to the accompanying drawings.

FIGS. 13A to 13C, 14A and 14B are sectional views showing process steps of the conventional method for fabricating a MIS transistor step by step.

First, as shown in FIG. 13A, indium (In) ions acting as a p-type dopant are implanted into a semiconductor substrate 200 made of p-type silicon at an implantation energy of 100 keV and a dose of about $1 \times 10^{14}/cm^2$. Thereafter, the resulting substrate is subjected to thermal treatment to form a p-diffused channel layer 203 in a channel formation region of the semiconductor substrate 200.

As shown in FIG. 13B, a gate oxide film 201 having a thickness of about 1.5 nm is then formed on the semiconductor substrate 200. On the gate oxide film 201, a gate electrode 202 is formed which is made of polysilicon having a thickness of about 150 nm.

Next, as shown in FIG. 13C, using the gate electrode 202 as a mask, arsenic (As) ions acting as an n-type dopant are implanted into the semiconductor substrate 200 at an implantation energy of 2 keV and a dose of about $5 \times 10^{14}/cm^2$, thereby forming n-type implantation layers 206A. Then, using the gate electrode 202 as a mask, boron (B) ions acting as a p-type dopant are implanted into the semiconductor substrate 200 at an implantation energy of 5 keV and a dose of about $2 \times 10^{13}/cm^2$, thereby forming p-type implantation layers 207A.

As shown in FIG. 14A, an insulating film of silicon nitride or the like having a thickness of about 50 nm is deposited on the implanted semiconductor substrate 200. The deposited insulating film is anisotropically etched to form sidewalls 208 on the side surfaces of the gate electrode 202.

As shown in FIG. 14B, using the gate electrode 202 and sidewalls 208 as a mask, arsenic ions acting as an n-type dopant are implanted into the semiconductor substrate 200 at an implantation energy of 15 keV and a dose of about $3 \times 10^{15}/cm^2$. The resulting semiconductor substrate 200 is subjected to high-temperature and short-time thermal treatment to form n-diffused source and drain layers 205 in regions of the semiconductor substrate 200 located at either side of the sidewalls 208. During this treatment, in regions of the semiconductor substrate 200 interposed between each of the n-diffused source and drain layers 205 and the p-diffused channel layer 203, n-diffused extension layers 206 are formed by the diffusion of the n-type implantation layers 206A. In regions of the semiconductor substrate 200 located below the n-diffused extension layers 206, p-diffused pocket layers 207 are formed by the diffusion of the p-type implantation layers 207A.

As described above, in order to miniaturize the MIS transistor without producing any short channel effect, the conventional fabricating method of the MIS transistor employs, as a dopant for forming the p-diffused channel layer 203, heavy ions of indium (In) having a larger mass number than boron (B) and in addition the conventional method has a tendency to increase the dose of indium ions.

When indium ions of high dose are implanted into the semiconductor substrate 200, however, the implanted region of the semiconductor substrate 200 is amorphized. This causes, in the subsequent thermal treatment for activation, formation of EOR (End-of-Range) dislocation loop defect layers (referred simply to as dislocation loop defect layers) in the vicinity of the lower side of the interface between the amorphous layer and the crystal layer. Indium contained therein segregates largely to the dislocation loop defect layers, so that the activation concentration of the p-diffused channel layer 203 decreases. As a result, the conventional method cannot provide a transistor having a desired dopant profile.

Moreover, if the dislocation loop defect layers are formed in the p-diffused channel layer 203, leakage current disadvantageously flows along the dislocation loop defect layers.

FIG. 15 illustrates the dopant profile of the p-diffused channel layer 203 taken along the A—A line in FIG. 13A. FIG. 15 plots the depth measured from the substrate surface in ordinate and the logarithm of the dopant concentration of indium in abscissa. As seen from the indium ion profile of FIG. 15, indium ions contained in the p-diffused channel layer 203 segregate by the thermal treatment to the dislocation loop defect layers formed in the vicinity of the amorphous-crystal interface.

As is apparent from the above, it is difficult for the conventional method for fabricating a semiconductor device to form a heavily-diffused channel layer, which is dispensable for a miniaturized transistor, to have a desired dopant concentration.

SUMMARY OF THE INVENTION

With the foregoing problems in mind, an object of the present invention is to ensure an increased dopant concentration of a dopant-diffused channel layer of a semiconductor device while the appearance of short channel effect accompanied with the miniaturization of the device is avoided, and to suppress an increase in leakage current flow resulting from a low threshold voltage and a highly doped channel of the device.

To attain the above object, a method for fabricating a semiconductor device of the present invention is designed so that first dopant ions which are heavy ions for forming a channel are implanted into a semiconductor substrate and then second dopant ions are implanted thereinto, thereby expanding (moving down) an amorphous-crystal interface to a region of the substrate deeper than a dopant implantation layer formed by implanting the first dopant ions.

To be more specific, a method for fabricating a semiconductor device according to the present invention comprises: a first step of implanting, into a channel formation region of a semiconductor substrate, first dopant ions of a first conductivity type which are heavy ions with a relatively large mass number to form a dopant implantation layer in the channel formation region; and a second step of implanting second dopant ions into the semiconductor substrate to form an amorphous layer expanding from the substrate surface to a region of the substrate deeper than the dopant implantation layer.

With the method for fabricating a semiconductor device of the present invention, the amorphous-crystal interface is moved down to the position in the substrate located deeper than that of the dopant implantation layer. Therefore, even if the subsequent thermal treatment is performed to restore the crystallinity of the substrate, no amorphous-crystal interface is formed in the dopant implantation layer. This eliminates the probability of occurrence of a dislocation loop defect layer in the dopant implantation layer during the thermal treatment after the heavy ion implantation, which prevents the phenomenon in which the heavy ions implanted in the channel formation region segregate to the dislocation loop defect layer to become inactivated. Moreover, since no dislocation loop defect layer is formed, leakage current flow resulting from the dislocation loop defect layer can be prevented as well.

It is known that even a relatively small dose of heavy ions generally amorphizes part of a semiconductor substrate because of their mass effect. In the present invention, the amorphous-crystal interface is expanded deeper than the channel formation region. Therefore, even though the heavy ions are implanted into the channel formation region at a higher dose than the extent that the ions induce amorphization of the region, the heavy ions cause no dislocation loop defect layer immediately below the channel formation region during the thermal treatment after the implantation. This suppresses segregation of the heavy ions immediately below the channel formation region, thereby attaining a heavily-doped and abrupt channel formation region with a retrograde profile.

Preferably in the inventive method, the semiconductor substrate is made of silicon and the second dopant ion belongs to group IV elements.

In this case, the plane orientation of the semiconductor substrate is preferably the {100} plane.

Also in this case, the semiconductor substrate preferably includes, in the upper portion thereof, an epitaxial layer formed by epitaxially growing silicon.

Furthermore in this case, the semiconductor substrate preferably includes, in the upper portion thereof, a strained silicon layer having a crystal lattice of a larger lattice constant than a normal lattice constant.

In the inventive method, the heavy ions are preferably indium ions.

In this case, the dose of the heavy ions to be implanted is preferably $5 \times 10^{13}/cm^2$ or more.

Preferably, the inventive method further comprises, after the second step, a third step of performing a first thermal treatment to diffuse the first dopant ions from the dopant implantation layer, thereby forming a first diffused layer of the first conductivity type in the channel formation region, a fourth step of selectively forming a gate insulating film on the semiconductor substrate and a gate electrode on the gate insulating film, a fifth step of implanting third dopant ions of a second conductivity type into the semiconductor substrate using the gate electrode as a mask, and a sixth step of performing a second thermal treatment on the semiconductor substrate to diffuse the third dopant ions, thereby forming a second diffused layer of the second conductivity type whose junction position is relatively shallow.

This method forms a diffused extension layer of the second diffused layer in the MIS transistor.

In this case, the first thermal treatment is preferably rapid thermal annealing performed at a heating rate of about 100° C./sec or higher, at a heating temperature of 850 to 1050° C., and either with the peak temperature of the treatment kept for 10 seconds at the maximum or with the peak temperature not kept.

Preferably, the inventive method further comprises, between the second and third steps, the step of performing a third thermal treatment at such a temperature that the first dopant ions do not diffuse from the dopant implantation layer and that the crystallinity of the amorphous layer is restored, thereby recovering crystal damages caused by the first dopant ions.

This method restores the crystallinity of the semiconductor substrate with implantation damages introduced by the heavy ion implantation in the first step while the occurrence of residual defects is prevented.

In this case, the heating temperature of the third thermal treatment is preferably 400 to 600° C. Also in this case, the heating time of the third thermal treatment is preferably 1 to 20 hours.

Preferably, the inventive method further comprises, between the fourth and sixth steps, the step of implanting fourth dopant ions of the first conductivity type into the semiconductor substrate using the gate electrode as a mask, and the second thermal treatment performed in the sixth step diffuses the fourth dopant ions, thereby forming a third diffused layer of the first conductivity type below the second diffused layer. With this method, a dopant-diffused pocket layer made of the third diffused layer can surely be formed below the second diffused layer.

Preferably, the inventive method further comprises, after the sixth step, the step of forming sidewalls of an insulating film on the side surfaces of the gate electrode, and the step of implanting fifth dopant ions of the second conductivity type into the semiconductor substrate using the gate electrode and the sidewalls as a mask and then performing a fourth thermal treatment to diffuse the fifth dopant ions, thereby forming, outside the second diffused layer, a fourth diffused layer of the second conductivity type which has a deeper junction interface than the second diffused layer.

This method forms diffused source and drain layers in regions of the semiconductor substrate located at either side of the sidewalls.

A semiconductor device of the present invention comprises: a semiconductor substrate including a diffused channel layer in the upper portion thereof; and a gate electrode formed above the semiconductor substrate with a gate insulating film interposed therebetween, and the diffused channel layer is formed by implanting dopant ions which are heavy ions with a relatively large mass number, and the diffused channel layer contains germanium ions.

Preferably in the inventive device, germanium ions are contained also in a region of the semiconductor substrate located below the diffused channel layer.

DETAILED DESCRIPTION OF THE PREFERRED EMBODIMENTS

First Embodiment

A first embodiment of the present invention will be described below with reference to the accompanying drawings.

Figure 1:
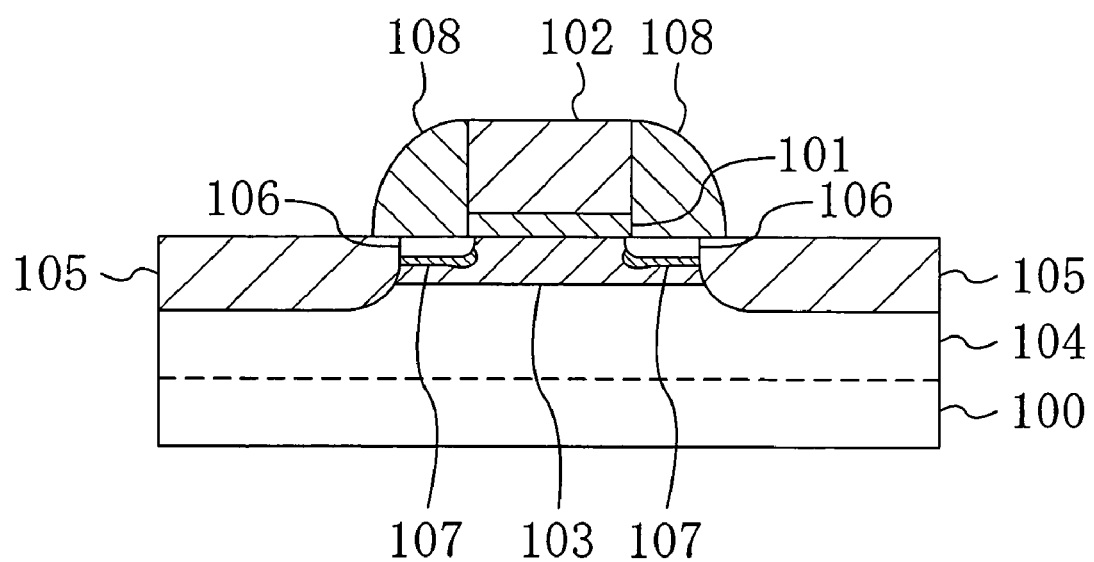
FIG. 1 is a sectional view illustrating a construction of a MIS transistor according to a first embodiment of the present invention.

FIG. 1 shows a cross-sectional construction of a MIS transistor according to the first embodiment of the present invention.

Referring to FIG. 1, a gate insulating film 101 of silicon oxide is formed on the main surface of a semiconductor substrate 100 of p-type silicon (Si), for example. On the gate insulating film 101, a gate electrode 102 of polysilicon is formed. On the both side surfaces of the gate electrode 102, sidewalls 108 of silicon nitride are formed.

In a region of the semiconductor substrate 100 located below the gate insulating film 101, a p-diffused channel layer 103 is formed by implanting indium (In) ions which are heavy ions with a relatively large mass number.

In a region of the semiconductor substrate 100 deeper than the diffused channel layer 103, a germanium (Ge)-containing layer 104 is formed by implanting ions, such as germanium ions, belonging to group IV elements by the implantation of which the conductivity of the semiconductor substrate 100 will not be changed. In this implantation, as shown in FIG. 5C, the dopant concentration of germanium contained in the deeper side of the diffused channel layer 103 is about $1\times10^{15}$ to $1\times10^{17}$ atoms/cm$^3$. On the other hand, the dopant concentration of germanium contained in the interface between silicon and the insulating film such as the gate insulating film 101 or the sidewall 108 is about $5\times10^{18}$ to $5\times10^{21}$ atoms/cm$^3$, which is very high. Therefore, the transistor shows an abrupt dopant profile.

In regions of the semiconductor substrate 100 located at either side of the sidewalls 108, heavily n-diffused layers 105 are formed by implanting arsenic (As) ions or the like.

In areas of the p-diffused channel layer 103 located below the sidewalls 108, heavily n-diffused extension layers 106 are formed by implanting arsenic (As) ions. Below the heavily n-diffused extension layers 106, p-diffused pocket layers 107 are formed which have a higher p-type dopant concentration than the semiconductor substrate 100. Each of the p-diffused pocket layers 107 creates, in the upper side thereof, a PN junction interface with the corresponding heavily n-diffused extension layer 106, thereby preventing a depletion layer from expanding during the operation of the transistor.

Hereinafter, a fabricating method of the MIS semiconductor device thus constructed will be described with reference to the accompanying drawings.

FIGS. 2A to 2C, 3A to 3C, 4A and 4B are sectional views showing process steps of the fabricating method of a MIS transistor according to the first embodiment of the present invention step by step.

Figure 2A:
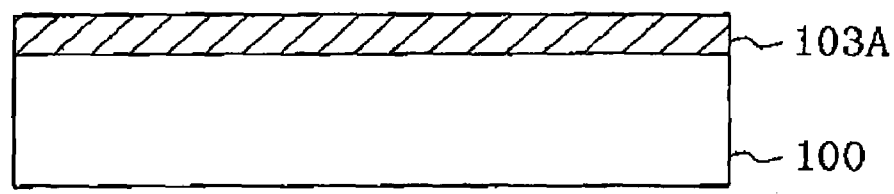
FIGS. 2A through 2C are sectional views showing process steps of a fabricating method of a MIS transistor according to the first embodiment of the present invention step by step.

First, as shown in FIG. 2A, p-type dopant ions with a relatively large mass number, such as indium (In) ions, are implanted into a channel formation region of the semiconductor substrate 100 made of p-type silicon at an implantation energy of about 70 keV and a dose of about $5\times10^{13}$/cm$^2$. A p-doped channel layer 103A is thus formed.

Figure 2B:
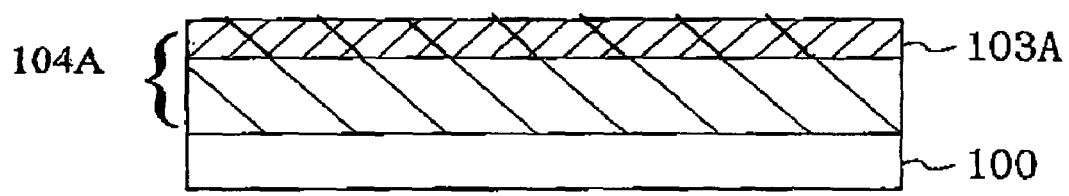

Subsequently, as shown in FIG. 2B, germanium (Ge) ions, for example, belonging to group IV elements are implanted into the upper portion of the semiconductor substrate 100 at an implantation energy of about 250 keV and a dose of about $1\times10^{16}$/cm$^2$, thereby forming an amorphous layer 104A expanding from the substrate surface to a region of the semiconductor substrate 100 deeper than the p-doped channel layer 103A. Note that the group IV element used in the formation of the amorphous layer 104A may be silicon instead of germanium. As another substitute for germanium, a dopant ion exhibiting the seine conductivity type as the p-doped channel layer 1034, such as an indium ion, may be used.

In the first embodiment, indium ions are first implanted and then germanium ions are implanted. Alternatively, germanium ions may first be implanted and then indium ions may be implanted. In this case, however, because of the pre-amorphous effect caused by the implantation of germanium ions, the junction depth of the p-doped channel layer 103A becomes shallow as compared to that of the ion implantation of indium ions only.

Figure 2C:
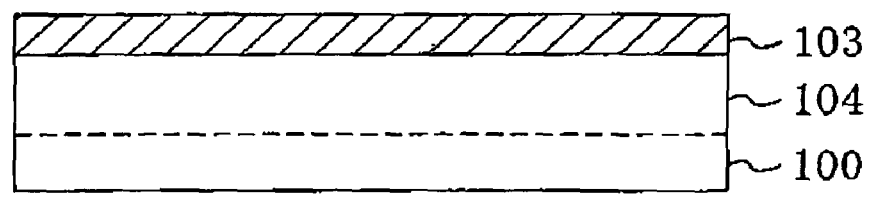

As shown in FIG. 2C, subsequently to the ion implantation of germanium, the semiconductor substrate 100 is heated to about 850 to 1050° C. at a heating rate of about 100° C./sec or more, preferably at about 200° C./sec. After the heating, rapid thermal annealing (RTA) is performed either with the peak temperature thereof kept for about 10 seconds at the maximum or with the peak temperature not kept. This RTA diffuses the indium ions contained in the p-doped channel layer 103A into the upper portion of the semiconductor substrate 100 to form the p-diffused channel layer 103 as a first diffused layer. Simultaneously with this, the RTA restores the amorphous layer 104A formed by the germanium ion implantation to a crystalline state. However, since this layer contains germanium, it is herein referred to as the Ge-containing layer 104. Note that the RTA with the peak temperature not kept means that the thermal treatment temperature is lowered on reaching the peak temperature.

Figure 3A:
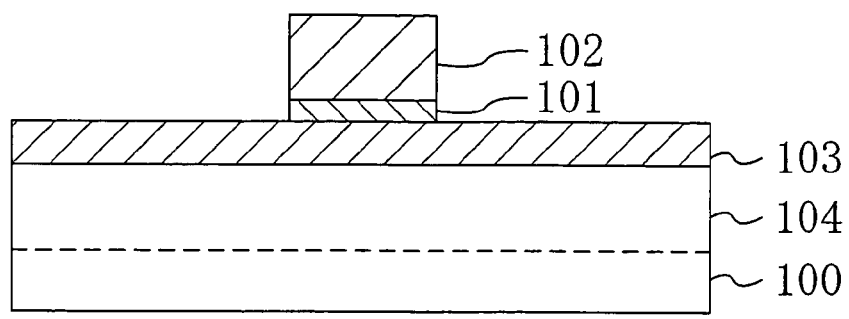
FIGS. 3A through 3C are sectional views showing process steps of the fabricating method of a MIS transistor according to the first embodiment of the present invention step by step.

Next, as shown in FIG. 3A, the gate insulating film 101 of silicon oxide having a thickness of about 1.5 nm is selectively formed on the semiconductor substrate 100. On the gate insulating film 101, the gate electrode 102 is selectively formed which is made of polysilicon or polymetal having a thickness of about 150 nm.

Figure 3B:
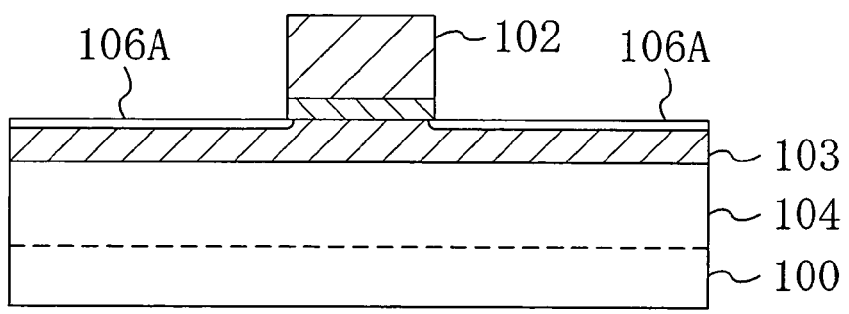

As shown in FIG. 3B, using the gate electrode 102 as a mask, n-type dopant ions such as arsenic (As) ions are implanted into the semiconductor substrate 100 at an implantation energy of about 3 keV and a dose of about $4 \times 10^{14}/cm^2$, thereby forming heavily n-doped extension layers 106A.

Figure 3C:
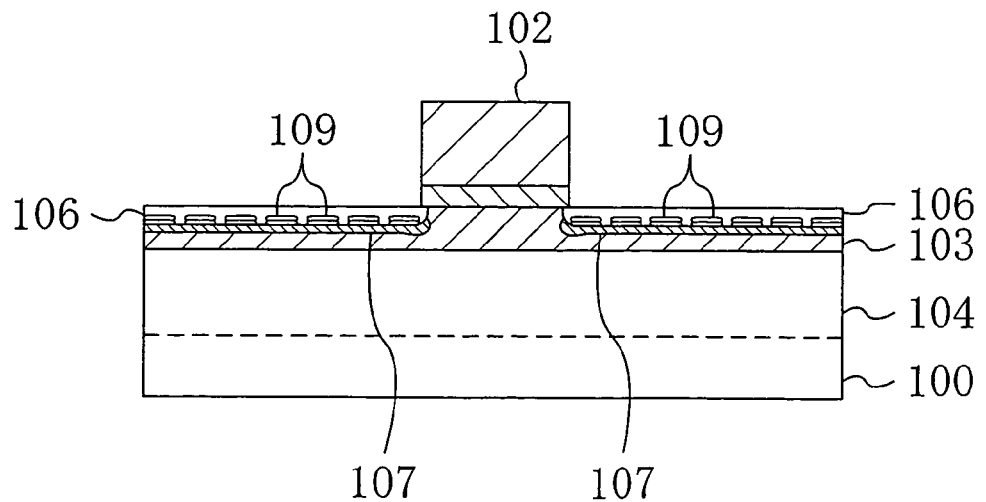

The semiconductor substrate 100 is heated to about 850 to 1050° C. at a heating rate of about 200° C./sec. After the heating, rapid thermal annealing (RTA) is performed either with the peak temperature thereof kept for about 10 seconds at the maximum or with the peak temperature not kept. As shown in FIG. 3C, this RTA diffuses the arsenic ions contained in the heavily n-doped extension layers 106A into portions of the semiconductor substrate 100 located at the sides of the gate electrode 102, thereby forming the heavily n-diffused extension layers 106 as second diffused layers which have relatively shallow junction interfaces. Moreover, the RTA restores the amorphous layer formed by the arsenic ion implantation to a crystalline state and forms dislocation loop defect layers 109 on the lower side of the amorphous-crystal interface in the implantation. As a result of the RTA, indium contained in the p-diffused channel layer 103 segregates to the dislocation loop defect layers 109 as shown in FIG. 3C, whereby the p-diffused pocket layers 107 as third diffused layers having a higher dopant concentration than the p-diffused channel layer 103 are formed below the heavily n-diffused extension layers 106. The p-diffused pocket layers 107 are formed in a self-aligned manner by the interaction between the dislocation loop defect layers and indium contained in the p-diffused channel layer 103.

Figure 4A:
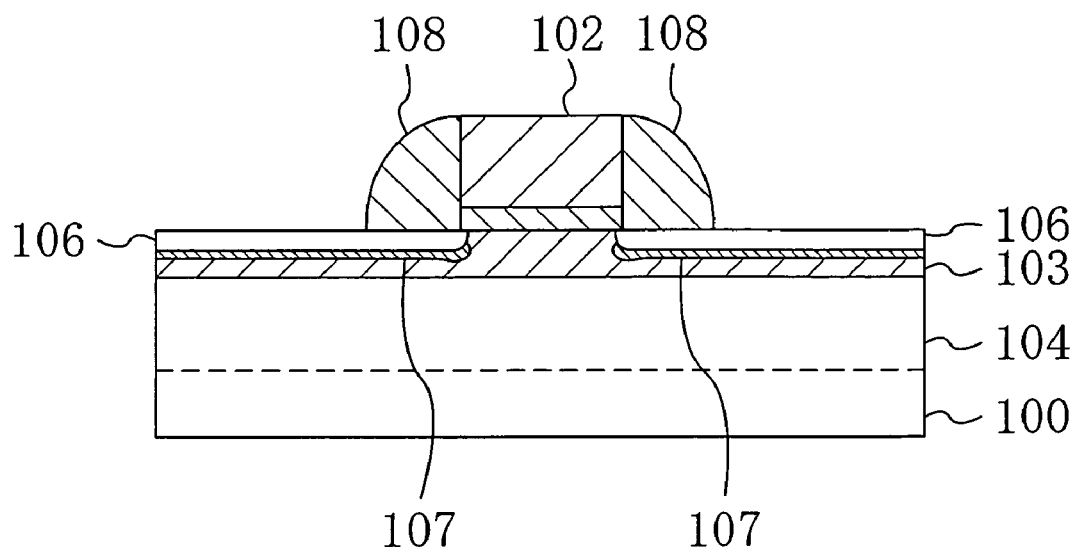
FIGS. 4A and 4B are sectional views showing process steps of the fabricating method of a MIS transistor according to the first embodiment of the present invention step by step.

Thereafter, by chemical vapor deposition (CVD) or the like, a silicon nitride film having a thickness of about 50 nm is deposited on the entire surface of the semiconductor substrate 100 including the gate electrode 102. The deposited silicon nitride film is anisotropically etched to form sidewalls 108 of silicon nitride, as shown in FIG. 4A, on the both side surfaces of the gate electrode 102 in the direction of the gate length. The sidewalls 108 may be made of silicon oxide instead of silicon nitride. As another substitute for silicon nitride, a stacked film may be used which is made of silicon oxide and silicon nitride.

Figure 4B:
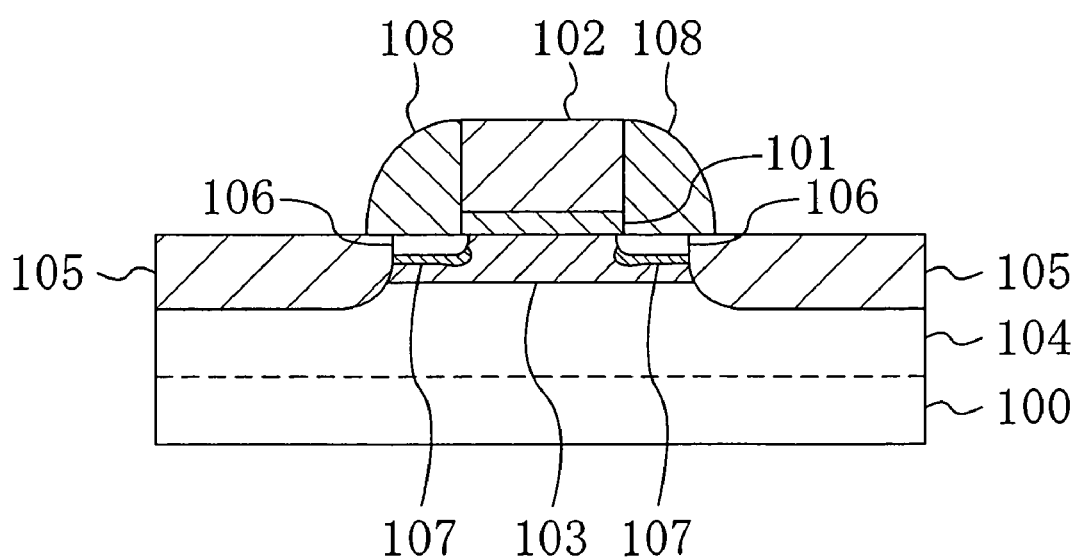

Using the gate electrode 102 and sidewalls 108 as a mask, arsenic ions acting as an n-type dopant are implanted into the semiconductor substrate 100 at an implantation energy of about 30 keV and a dose of about $3 \times 10^{15}/cm^2$. The resulting semiconductor substrate 100 is heated to about 850 to 1050° C. at a heating rate of about 200 to 250° C./sec, after which rapid thermal annealing (RTA) is performed either with the peak temperature thereof kept for about 10 seconds at the maximum or with the peak temperature not kept. As shown in FIG. 4B, this RTA diffuses the arsenic ions into portions of the semiconductor substrate 100 located at either side of the sidewalls 108, thereby forming the heavily n-diffused layers 105 as fourth diffused layers which are in contact with the heavily n-diffused extension layers 106, respectively, and which have relatively deep junction interfaces as compared to the layers 106.

Figure 5A:
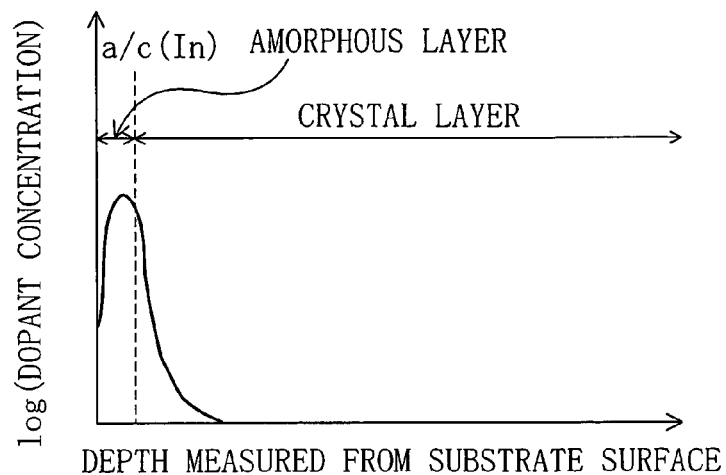
FIGS. 5A through 5C are graphs showing dopant profiles in the process steps illustrated in FIGS. 2A through 2C, respectively.
Figure 5B:
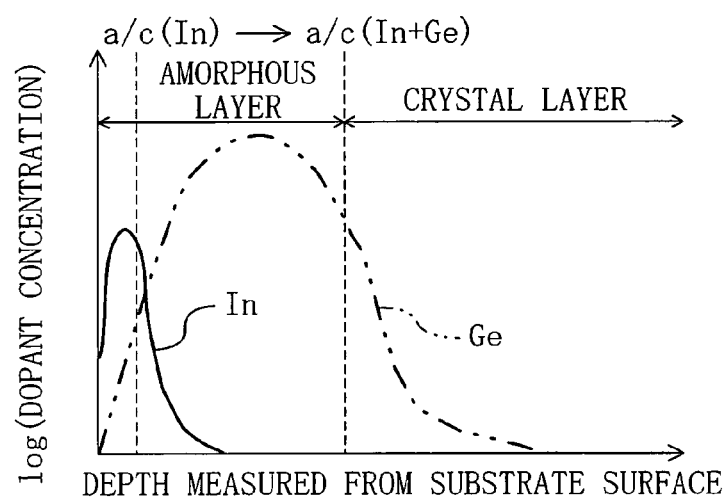
Figure 5C:
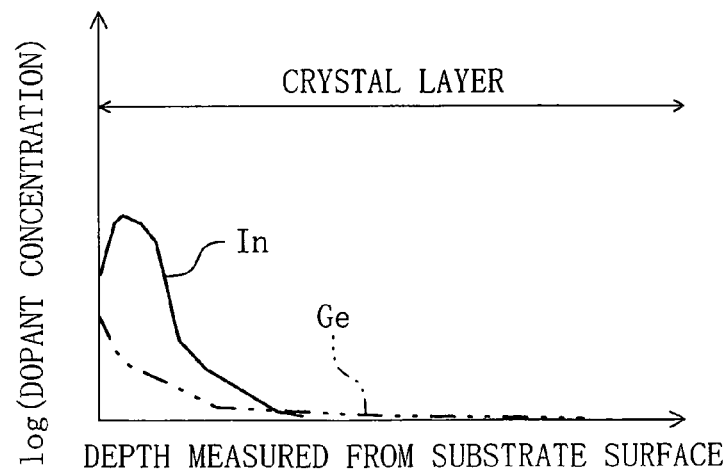

FIGS. 5A to 5C show dopant profiles in the process steps illustrated in FIGS. 2A to 2C, respectively. Each of the figures plots the depth measured from the substrate surface in ordinate and the logarithm of the dopant concentration in abscissa.

First, as shown in FIG. 5A, the implantation of indium (In) ions for forming the p-doped channel layer 103A shown in FIG. 2A forms an amorphous-crystal (a/c) interface immediately below the region of the semiconductor substrate 100 at which the dopant concentration of indium reaches the peak.

Next, as shown in FIG. 5B, the relatively-deep implantation of germanium (Ge) ions for forming the amorphous layer 104A shown in FIG. 2B transfers the amorphous-crystal interface to the position in the semiconductor substrate 100 deeper than the peak position of the dopant concentration of germanium.

Subsequently, as shown in FIG. 5C, the rapid thermal annealing shown in FIG. 2C restores the amorphous layer 104A formed by the implantations of indium ions and germanium ions to the crystal layer.

In general, silicon crystals are amorphized when indium ions are implanted at a dose of about $5 \times 10^{13}/cm^2$ or greater. In the first embodiment, indium ion implantation is performed at a dose of about $5 \times 10^{13}/cm^2$, so that the amorphous layer 104A is formed in the silicon substrate. Taking this into consideration, in the first embodiment, germanium ions which will not change the conductivity type of the semiconductor substrate 100 are implanted into the semiconductor substrate 100 subsequently to the indium ion implantation, so that the amorphous-crystal (a/c) interface is expanded from the region immediately below the p-doped channel layer 103A to the deeper position. As a result, the p-diffused channel layer 103 of high dopant concentration can be formed reliably while no implanted indium segregates to the dislocation loop defect layers.

As described above, when the p-diffused channel layer 103 is formed in the first embodiment, indium ions, which are heavy ions with a relatively large mass number, are implanted at a dose of about $5 \times 10^{13}/cm^2$, after which germanium ions belonging to the same group as the element constituting the semiconductor substrate 100 are implanted for amorphization. Thus, the amorphous-crystal interface formed by the indium implantation can be expanded in the depthwise direction of the substrate.

The amorphous-crystal interface is thus expanded in the depthwise direction of the substrate, whereby the dislocation loop defect layers affecting diffusion of indium ions are not formed in the vicinity of the p-diffused channel layer 103 during the thermal treatment for forming the p-diffused channel layer 103 from the p-doped channel layer 103A. Therefore, even though indium ions, which are heavy ions for forming a channel, are implanted at a higher dose than the extent that the ions induce amorphization, the conventional phenomenon can be avoided in which indium segregates largely to the dislocation loop defect layers and then the activation concentration of the p-diffused channel layer 103 is lowered. Accordingly, with the first embodiment, not several-time implantations but only one-time implantation of heavy ions for forming the diffused channel layer can provide a diffused channel layer of high dopant concentration.

Moreover, the implantation of dopant ions belonging to group IV elements for amorphization contributes to separation of the amorphous-crystal interface from the p-diffused channel layer 103, so that no dislocation loop defect layer is formed in the vicinity of the channel region. Therefore, leakage current flow resulting from the dislocation loop defect layer can be prevented as well.

As is apparent from the above, with the first embodiment, a heavily p-diffused channel layer 103 containing indium ions which are heavy ions can be formed reliably in the transistor.

Furthermore, an indium ion with a relatively large mass number is used in the formation of the p-diffused channel layer 103, so that the vicinity of the substrate surface of the p-diffused channel layer 103 has a low dopant concentration while the region thereof slightly deeper than the substrate surface has a high dopant concentration. That is to say, a retrograde dopant profile can be provided in this layer. This prevents a decrease in carrier mobility mainly resulting from dopant dispersion and minimizes the appearance of short channel effect. As a result, a transistor including this layer can be miniaturized reliably.

When the arsenic ions are implanted for forming the heavily n-doped extension layer 106A, part of the semiconductor substrate 100 is amorphized. Thus, the rapid thermal annealing subsequent to the arsenic ion implantation forms the dislocation loop defect layers 109 on the lower side of the amorphous-crystal interface. It is known that indium segregates largely to the dislocation loop defect layer 109. In the first embodiment, indium is used as a dopant ion for the p-diffused channel layer 103, so that the region to which indium segregates largely is formed in the dislocation loop defect layer 109, that is to say, on the lower side of the junction interface of the heavily n-diffused extension layer 106. Since this region functions as the p-diffused pocket layer 107, there is no need to add a formation step of the p-diffused pocket layer 107.

As a method for positively forming the p-diffused pocket layer 107, a p-type dopant may be implanted, subsequently to the arsenic ion implantation in FIG. 3B, into the semiconductor substrate 100 using the gate electrode 102 as a mask. For example, boron (B) ions acting as a p-type dopant are implanted at an implantation energy of about 10 keV and a dose of about $1 \times 10^{13}/cm^2$, which covers a shortage of dopant concentration of the p-diffused pocket layer 107.

In the first embodiment, an indium ion is used as a dopant ion for the p-diffused channel layer 103. Alternatively, use may be made of an ion which is heavier than a boron ion and which acts as a p-type dopant, or both of the boron ion and the ion which is heavier than the boron ion and which acts as a p-type dopant. As another alternative, a group 3B element having larger mass number than indium may be used.

In the first embodiment, an n-channel MIS transistor is used as a semiconductor device. Alternatively, a p-channel MIS transistor may be used. For the p-channel MIS transistor, a group 5B element heavier than an arsenic ion, such as an antimony (Sb) ion or a bismuth (Bi) ion, can be used as an n-type dopant ion constituting a diffused channel layer.

Second Embodiment

A second embodiment of the present invention will be described below with reference to the accompanying drawings.

FIGS. 6A to 6C, 7A to 7C, and 8A to 8C are sectional views showing process steps of a fabricating method of a MIS transistor according to the second embodiment of the present invention step by step.

Figure 6A:
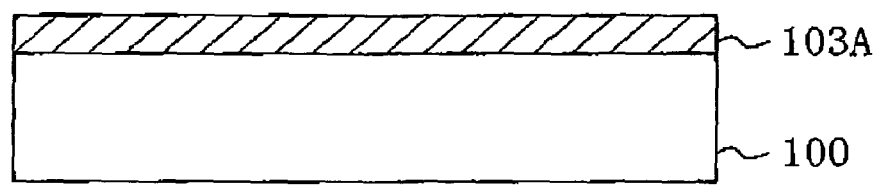
FIGS. 6A through 6C are sectional views showing process steps of a fabricating method of a MIS transistor according to a second embodiment of the present invention step by step.

First, as shown in FIG. 6A, p-type dopant ions with a relatively large mass number, such as indium (In) ions, are implanted into a channel formation region of a semiconductor substrate 100 made of p-type silicon at an implantation energy of about 70 keV and a dose of about $5 \times 10^{13}/cm^2$. A p-doped channel layer 103A is thus formed.

Figure 6B:
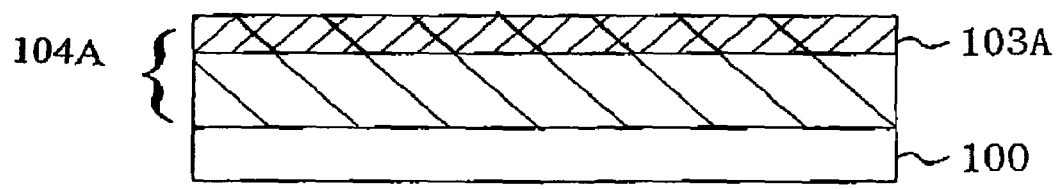

Subsequently, as shown in FIG. 6B, germanium (Ge) ions, for example, belonging to group IV elements are implanted into the upper portion of the semiconductor substrate 100 at an implantation energy of about 250keV and a dose of about $1 \times 10^{16}/cm^2$, thereby forming an amorphous layer 104A expanding from the substrate surface to a region of the semiconductor substrate 100 deeper than the p-doped channel layer 103A. Also in the second embodiment, the group IV element used in the formation of the amorphous layer 104A may be silicon instead of germanium. As another substitute for germanium, a dopant ion exhibiting the same conductivity type as the p-doped channel layer 103A, such as an indium ion, may be used.

Also in the second embodiment, indium ions are first implanted and then germanium ions are implanted. Alternatively, germanium ions may first be implanted and then indium ions may be implanted. As has been described earlier, in this case, the junction depth of the p-doped channel layer 103A becomes shallow as compared to the ion implantation of only indium ions because of the pre-amorphous effect caused by the implantation of germanium ions.

Figure 6C:
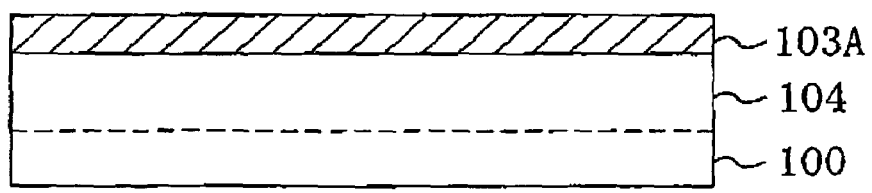

As shown in FIG. 6C, subsequently to the ion implantation of germanium, the semiconductor substrate 100 is heated to about 400 to 600° C. and subjected to thermal treatment for about 1 to 20 hours, preferably for 5 to 15 hours. This treatment recovers crystal damages caused by the implantation of the indium ions while the implanted two-type ions hardly diffuse. As a result, the amorphous layer 104A changes to a Ge-containing layer 104 in a crystalline state. Thus, the thermal treatment of relatively low temperature and long time is performed on the amorphous layer 104A, whereby the amorphous layer 104A of the semiconductor substrate 100 made of silicon regrows into a crystal layer (the Ge-containing layer 104). Such solid phase regrowth is generally known as "Solid Phase Epitaxial (SPE) regrowth". The SPE regrowth begins at the time the heat with a low temperature of about 400° C. is added during heat treatment, and recrystallization proceeds. The diffusion coefficient of a typical dopant at about 400° C. is sufficiently small as compared to that of a point defect, so that the dopant hardly diffuses. Therefore, by performing the relatively low-temperature thermal treatment for a sufficiently long time, excessive number of point defects present immediately below the amorphous-crystal interface can be reduced while the dopant atoms hardly diffuse. In addition, the phase transition from the amorphous layer to the crystal layer can be induced.

As discussed above, the characteristic of the second embodiment is that heat treatment of low temperature is performed after the germanium ion implantation for expanding (moving down) the amorphous-crystal interface, which is formed by the ion implantation for forming the p-doped channel layer 103A, to the deeper position in the semiconductor substrate 100. This restores the crystal structure of the amorphous layer 104A formed by the implantation of indium and germanium at high doses. The temperature of this treatment is sufficiently low, so that dopant dispersion caused by transient enhanced diffusion hardly occurs and only the restoration of the crystallinity proceeds. Therefore, the position of the junction interface of the p-doped channel layer 103A is almost the same as the position thereof located immediately after the implantation of indium ions.

Figure 7A:
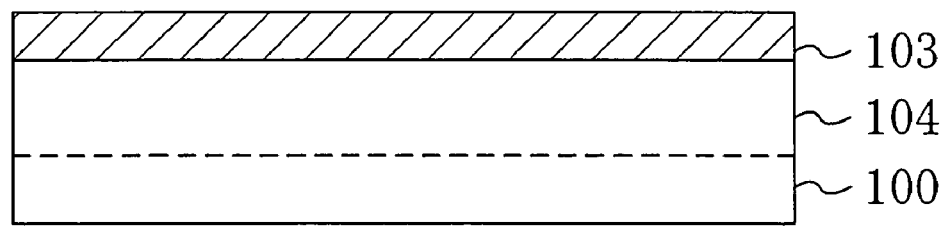
FIGS. 7A through 7C are sectional views showing process steps of the fabricating method of a MIS transistor according to the second embodiment of the present invention step by step.

As shown in FIG. 7A, subsequently to the thermal treatment, the semiconductor substrate 100 is heated to about 850 to 1050° C. at a heating rate of about 100° C./sec or more, preferably at about 200° C./sec. After the heating, rapid thermal annealing (RTA) is performed either with the peak temperature thereof kept for about 10 seconds at the maximum or with the peak temperature not kept. This RTA diffuses the indium ions contained in the p-doped channel layer 103A into the upper portion of the semiconductor substrate 100 to form the p-diffused channel layer 103 as a first diffused layer. The RTA carries out the activation of the implanted indium ions which cannot be done in the low-temperature thermal treatment in the step shown in FIG. 6C.

Figure 7B:
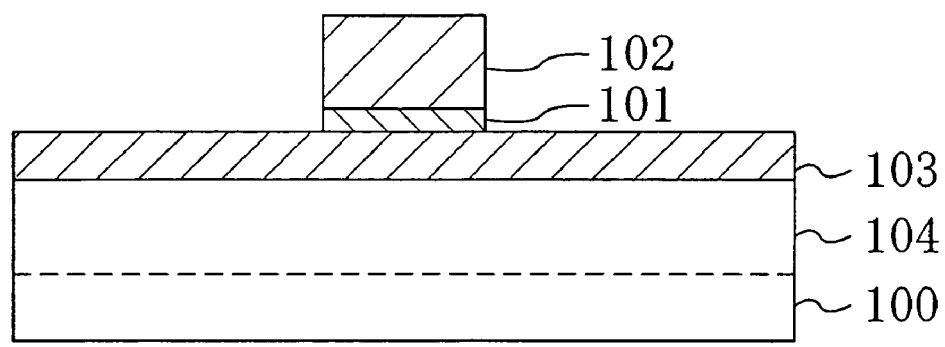

Next, as shown in FIG. 7B, a gate insulating film 101 of silicon oxide having a thickness of about 1.5 nm is selectively formed on the semiconductor substrate 100. On the gate insulating film 101, a gate electrode 102 is selectively formed which is made of polysilicon or polymetal having a thickness of about 150 nm.

Figure 7C:
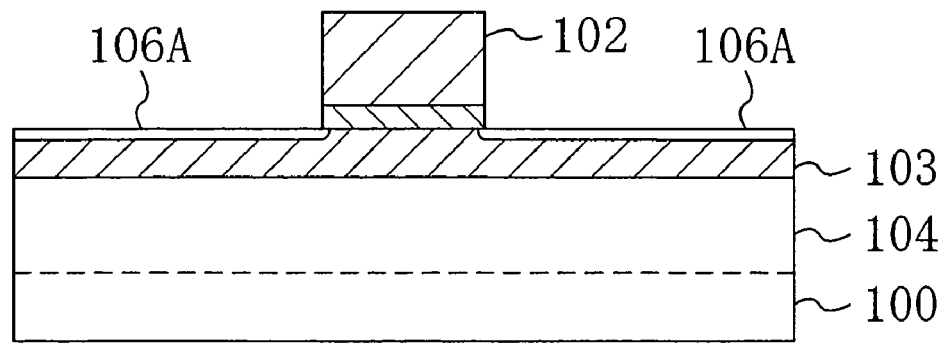

As shown in FIG. 7C, using the gate electrode 102 as a mask, n-type dopant ions such as arsenic (As) ions are implanted into the semiconductor substrate 100 at an implantation energy of about 3 keV and a dose of about $4 \times 10^{14}/cm^2$, thereby forming heavily n-doped extension layers 106A.

Figure 8A:
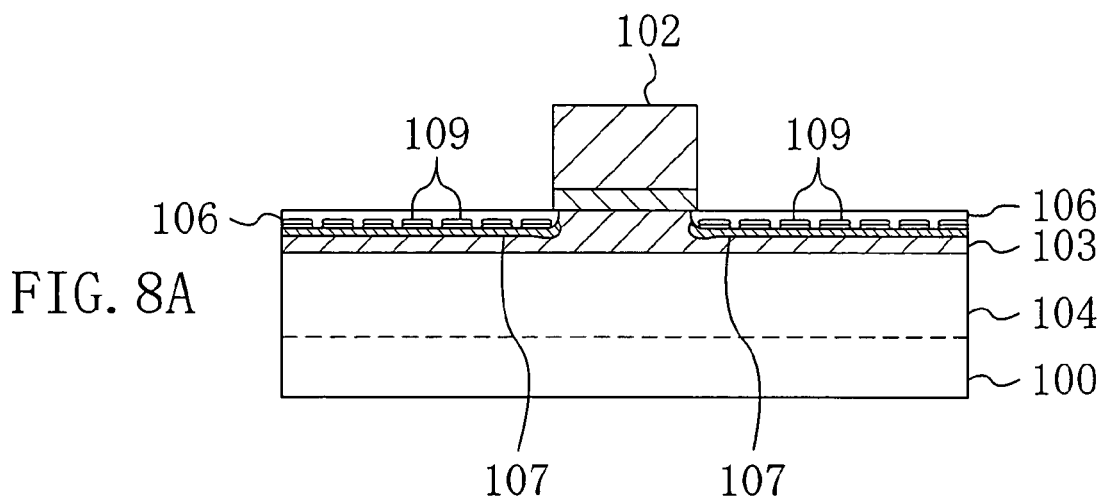
FIGS. 8A through 8C are sectional views showing process steps of the fabricating method of a MIS transistor according to the second embodiment of the present invention step by step.

The semiconductor substrate 100 is heated to about 850 to 1050° C. at a heating rate of about 200° C./sec. After the heating, rapid thermal annealing (RTA) is performed either with the peak temperature thereof kept for about 10 seconds at the maximum or with the peak temperature not kept. As shown in FIG. 8A, this RTA diffuses the arsenic ions contained in the heavily n-doped extension layers 106A into portions of the semiconductor substrate 100 located at the sides of the gate electrode 102, thereby forming heavily n-diffused extension layers 106 as second diffused layers which have relatively shallow junction interfaces. Moreover, this RTA restores the amorphous layer formed by arsenic ion implantation to a crystalline state and forms dislocation loop defect layers 109 on the lower side of the amorphous-crystal interface in the implantation. As a result of the RTA, indium contained in the p-diffused channel layer 103 segregates to the dislocation loop defect layers 109 as shown in FIG. 8A, whereby p-diffused pocket layers 107 as third diffused layers having a higher dopant concentration than the p-diffused channel layer 103 are formed below the heavily n-diffused extension layers 106. The p-diffused pocket layers 107 are formed in a self-aligned manner by the interaction between the dislocation loop defect layers and indium contained in the p-diffused channel layer 103.

Figure 8B:
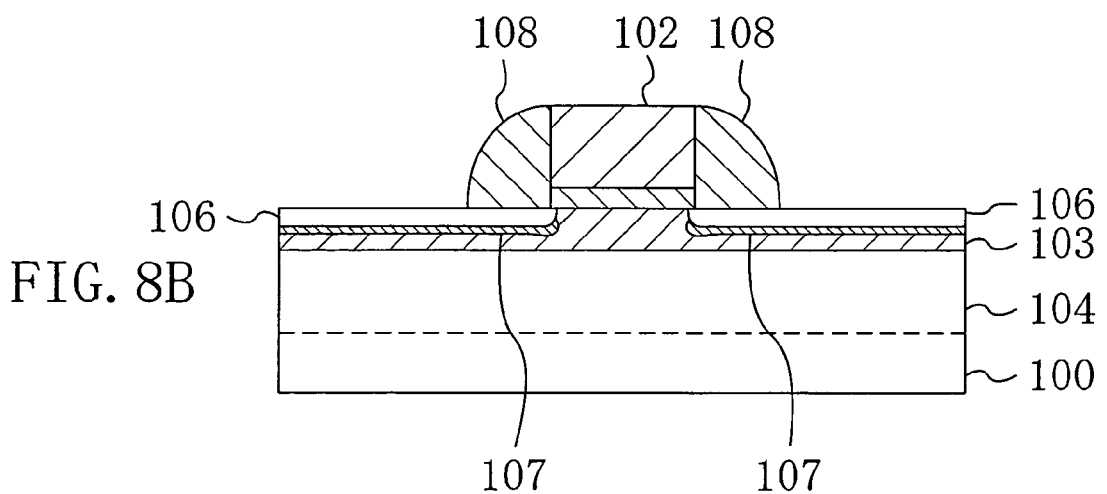

Thereafter, by chemical vapor deposition (CVD) or the like, a silicon nitride film of about 50 nm is deposited on the entire surface of the semiconductor substrate 100 including the gate electrode 102. The deposited silicon nitride film is anisotropically etched to form sidewalls 108 of silicon nitride, as shown in FIG. 8B, on the both side surfaces of the gate electrode 102 in the direction of the gate length. The sidewalls 108 may be made of silicon oxide instead of silicon nitride. As another substitute for silicon nitride, a stacked film may be used which is made of silicon oxide and silicon nitride.

Figure 8C:
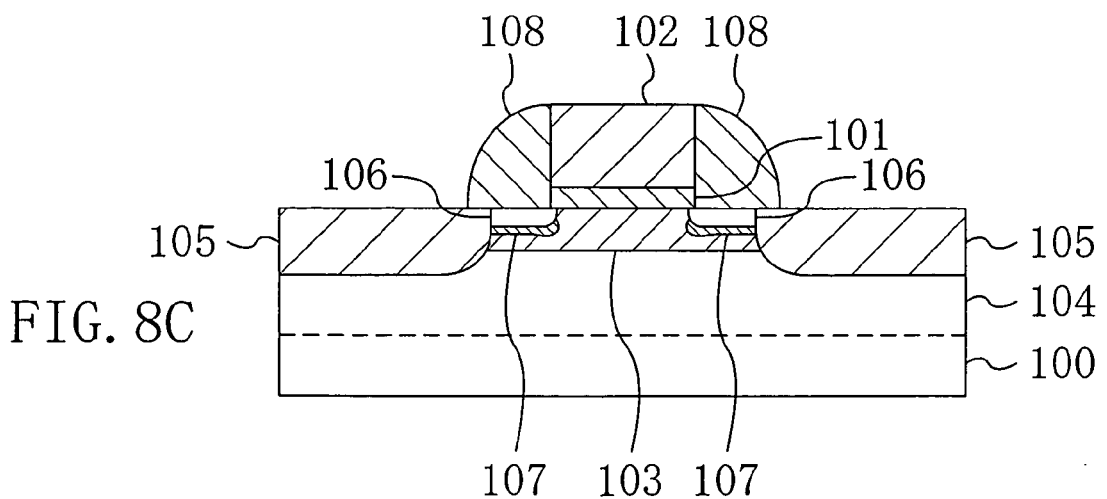

Using the gate electrode 102 and sidewalls 108 as a mask, arsenic ions acting as an n-type dopant are implanted into the semiconductor substrate 100 at an implantation energy of about 30 keV and a dose of about $3 \times 10^{15}/cm^2$. The resulting semiconductor substrate 100 is heated to about 850 to 1050° C. at a heating rate of about 200 to 250° C./sec, after which rapid thermal annealing (RTA) is performed either with the peak temperature thereof kept for about 10 seconds at the maximum or with the peak temperature not kept. As shown in FIG. 8C, this RTA diffuses the arsenic ions into portions of the semiconductor substrate 100 located at either side of the sidewalls 108, thereby forming heavily n-diffused layers 105 as fourth diffused layers which are in contact with the heavily n-diffused extension layers 106, relatively, and which have relatively deep junction interfaces as compared to the layers 106.

FIGS. 9A to 9C and 10 show dopant profiles in the process steps illustrated in FIGS. 6A to 6C and 7A, respectively. Each of the figures plots the depth measured from the substrate surface in ordinate and the logarithm of the dopant concentration in abscissa.

Figure 9A:
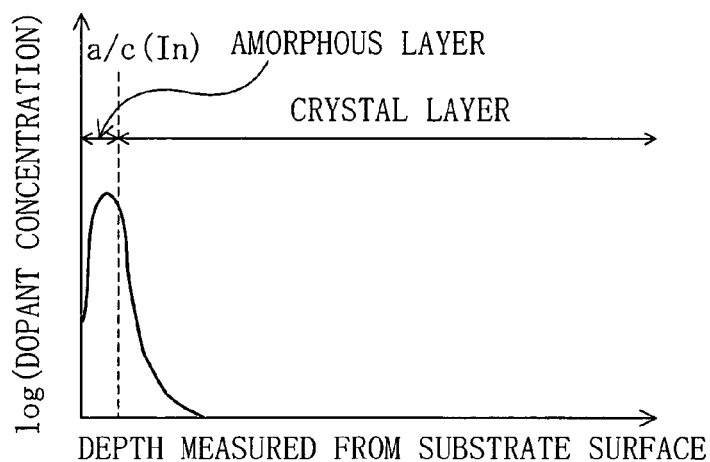
FIGS. 9A through 9C are graphs showing dopant profiles in the process steps illustrated in FIGS. 6A through 6C, respectively.

First, as shown in FIG. 9A, the implantation of indium (In) ions for forming the p-doped channel layer 103A shown in FIG. 6A forms an amorphous-crystal (a/c) interface immediately below the region of the semiconductor substrate 100 at which the dopant concentration of indium reaches the peak.

Figure 9B:
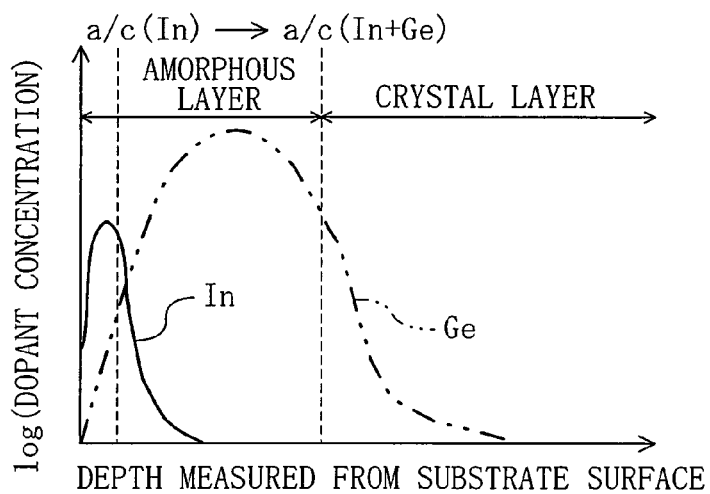

Next, as shown in FIG. 9B, the relatively-deep implantation of germanium (Ge) ions for forming the amorphous layer 104A shown in FIG. 6B transfers the amorphous-crystal interface to the position in the semiconductor substrate 100 deeper than the peak position of the dopant concentration of germanium.

Figure 9C:
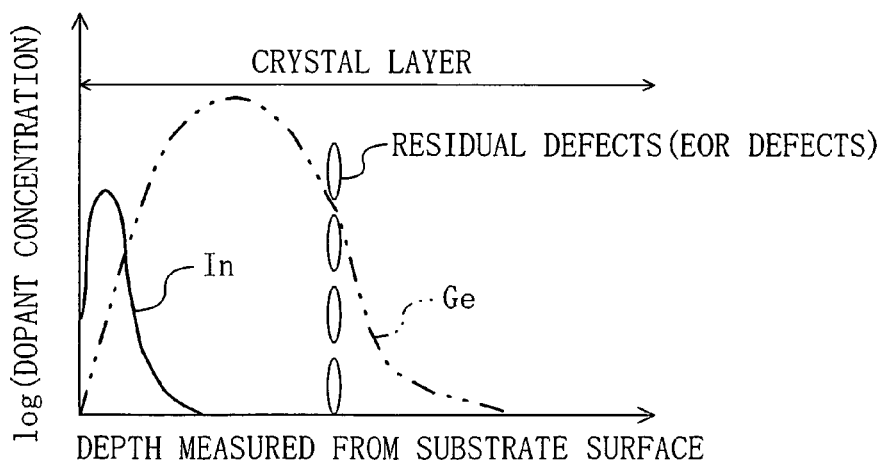

Subsequently, as shown in FIG. 9C, the low-temperature thermal treatment shown in FIG. 6C restores the amorphous layer 104A formed by the implantations of indium ions and germanium ions to the crystal layer. During this treatment, the implanted indium ions and germanium ions hardly diffuse, and residual defect (dislocation loop defect) layers occur immediately below the amorphous-crystal interface caused by germanium ions.

Figure 10:
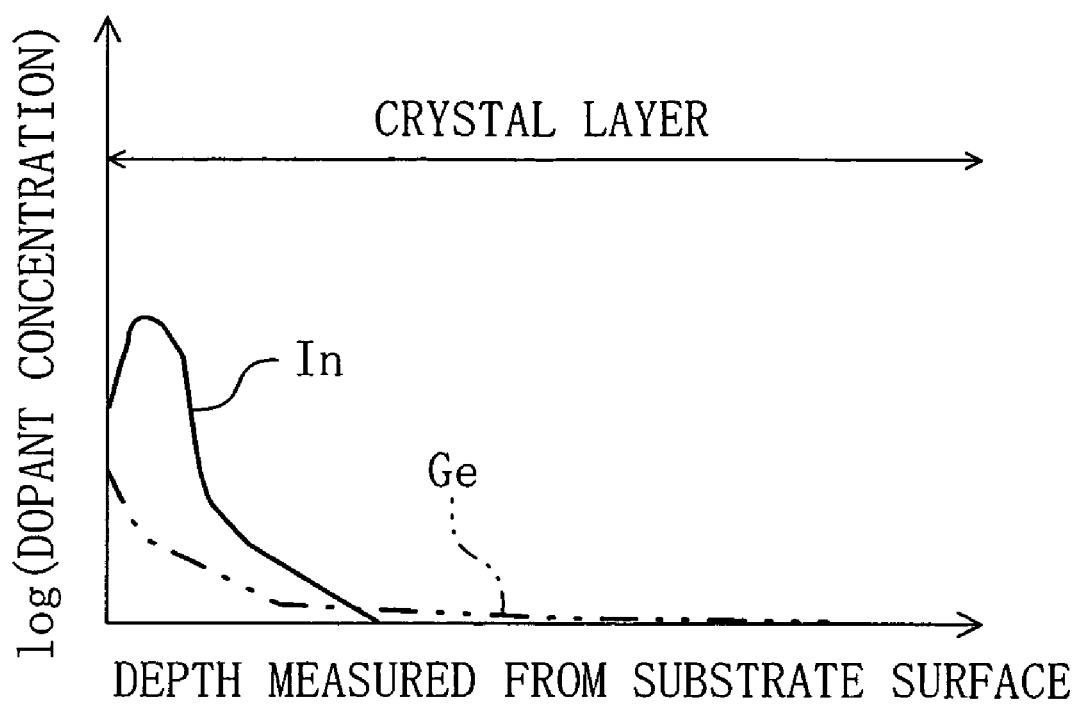
FIG. 10 is a graph showing a dopant profile in the process step illustrated in FIG. 7A.

Thereafter, as shown in FIG. 10, the rapid thermal annealing shown in FIG. 7A diffuses indium ions and eliminates the residual defect layers caused by germanium.

As described above, when the p-diffused channel layer 103 is formed in the second embodiment, indium ions, which are heavy ions with a relatively large mass number, are implanted at a dose of about $5 \times 10^{13}/cm^2$, after which germanium ions belonging to the same group as the element constituting the semiconductor substrate 100 are implanted for amorphization. Thus, the amorphous-crystal interface formed by the indium implantation can be expanded in the depthwise direction of the substrate, so that the dislocation loop defect layers affecting diffusion of indium ions are not formed in the vicinity of the p-diffused channel layer 103 during the thermal treatment for forming the p-diffused channel layer 103 from the p-doped channel layer 103A.

Moreover, in the second embodiment, the low-temperature thermal treatment shown in FIG. 6C is performed between the germanium ion implantation step shown in FIG. 6B and the high-temperature rapid thermal annealing (spike RTA) step for activating the indium ions shown in FIG. 7A, thereby restoring the crystallinity of the amorphous layer 104A. Since the temperature of the low-temperature thermal treatment is sufficiently low, crystal damages can be recovered with dopant diffusion hardly occurring. Therefore, only the regrowth of the amorphous layer 104A proceeds. As a result, only with the high-temperature rapid thermal annealing, the diffusion depth of indium can positively be made shallower than that of the first embodiment in which the restoration of the crystallinity of the amorphous layer 104A and the activation of the indium ions are performed at the same time.

Therefore, even though indium ions, which are heavy ions for forming a channel, are implanted at a higher dose than the extent that the ions induce amorphization, the conventional phenomenon can be avoided in which indium segregates largely to the dislocation loop defect layers and then the activation concentration of the p-diffused channel layer 103 is lowered. Accordingly, with the second embodiment, not several-time implantations but only one-time implantation of heavy ions for forming the diffused channel layer can provide a diffused channel layer of high dopant concentration.

Moreover, the implantation of dopant ions belonging to group IV elements for amorphization contributes to separation of the amorphous-crystal interface from the p-diffused channel layer 103, so that no dislocation loop defect layer is formed in the vicinity of the channel region. Therefore, leakage current flow resulting from the dislocation loop defect layer can be prevented as well.

As is apparent from the above, with the second embodiment, a heavily p-diffused channel layer 103 containing indium ions which are heavy ions can be formed reliably in the transistor.

Furthermore, an indium ion with a relatively large mass number is used in the formation of the p-diffused channel layer 103, so that the vicinity of the substrate surface of the p-diffused channel layer 103 has a low dopant concentration while the region thereof slightly deeper than the substrate surface has a high dopant concentration. That is to say, a retrograde dopant profile can be provided in the layer. This prevents a decrease in carrier mobility mainly resulting from dopant dispersion and minimizes the appearance of short channel effect. As a result, a transistor including this layer can be miniaturized reliably.

When the arsenic ions are implanted for forming the heavily n-doped extension layer 106A, part of the semiconductor substrate 100 is amorphized. Thus, the rapid thermal annealing subsequent to the arsenic ion implantation forms the dislocation loop defect layers 109 on the lower side of the amorphous-crystal interface. It is known that indium segregates largely to the dislocation loop defect layer 109. In the second embodiment, indium is used as a dopant ion for the p-diffused channel layer 103, so that the region to which indium segregates largely is formed in the dislocation loop defect layer 109, that is to say, on the lower side of the junction interface of the heavily n-diffused extension layer 106. Since this region functions as the p-diffused pocket layer 107, there is no need to add a formation step of the p-diffused pocket layer 107.

As a method for positively forming the p-diffused pocket layer 107, a p-type dopant may be implanted, subsequently to the arsenic ion implantation in FIG. 7C, into the semiconductor substrate 100 using the gate electrode 102 as a mask. For example, boron (B) ions acting as a p-type dopant are implanted at an implantation energy of about 10 keV and a dose of about $1 \times 10^{13}/cm^2$, which covers a shortage of dopant concentration of the p-diffused pocket layer 107.

Also in the second embodiment, an indium ion is used as a dopant ion for the p-diffused channel layer 103. Alternatively, use may be made of an ion which is heavier than a boron ion and which acts as a p-type dopant, or both of the boron ion and the ion which is heavier than the boron ion and which acts as a p-type dopant. As another alternative, a group 3B element having larger mass number than indium may be used.

In the second embodiment, an n-channel MIS transistor is used as a semiconductor device. Alternatively, a p-channel MIS transistor may be used. For the p-channel MIS transistor, group 5B element heavier than an arsenic ion, such as an antimony (Sb) ion or a bismuth (Bi) ion, can be used as an n-type dopant ion constituting a diffused channel layer.

The rapid thermal annealing step shown in FIG. 7A may be omitted. In this case, the rapid thermal annealing step shown in FIG. 8A simultaneously forms the p-diffused channel layer 103, the heavily n-diffused extension layer 106, and the p-diffused pocket layer 107.

In the first and second embodiments, as the semiconductor substrate 100, use may be made of silicon whose plane orientation is the {110} plane instead of silicon whose plane orientation is a normal plane, or the {100} plane. With the application of the substrate with the {110} plane, indium ions implanted into the substrate are channeled. Therefore, it becomes difficult to come into collision between the implanted indium ions and silicon crystal lattices constituting the semiconductor substrate 100, which weakens damages by the indium ion implantation to the silicon crystal lattices. As a result, the occurrence of interstitial silicon causing EOR dislocation loop defects decreases.

As the semiconductor substrate 100, use may be made of an epitaxial substrate in which an epitaxial layer of silicon is formed on the main surface of the semiconductor substrate 41. In general, a semiconductor provided by epitaxial growth excels a normal semiconductor provided by the crystal pulling method (Czochralski (CZ) method) in crystal quality, so that less number of EOR dislocation loop defects appear in the epitaxial substrate as compared to the number of defects that appears in the normal semiconductor substrate.

Furthermore, at least a channel region may include a so-called strained silicon layer whose silicon crystal lattice has a larger lattice constant than a normal crystal lattice and the silicon crystal lattice is strained. In the following third embodiment, description will be made of a concrete example of the device in which the channel region is provided with the strain silicon layer.

Third Embodiment

A semiconductor device including a strained silicon layer according to a third embodiment of the present invention will be described below with reference to the accompanying drawings.

Figure 11A:
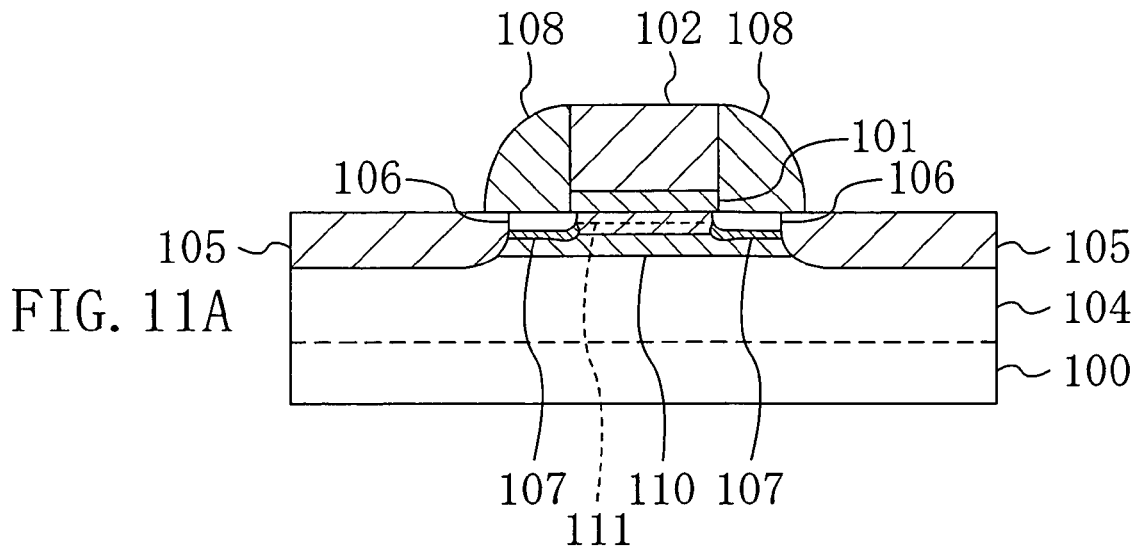
FIG. 11A is a sectional view illustrating a construction of a MIS transistor according to a third embodiment of the present invention.

FIG. 11A shows a cross-sectional construction of a MIS transistor according to the third embodiment of the present invention. The description of the components shown in FIGS. 11A to 11C that are the same as those shown in FIG. 1 will be omitted by retaining the same reference numerals, and only the difference between the two figures will be described.

Referring to FIG. 11A, a buffer layer 110 of silicon germanium ($Si_{1-x}Ge_x$, where 0<x<1) having a thickness of 50 to 100 nm is formed on the main surface of the p-type semiconductor substrate 100. On the buffer layer 110, a strained silicon layer 111 having a thickness of 20 to 50 nm is formed by epitaxially growing silicon.

Figure 11B:
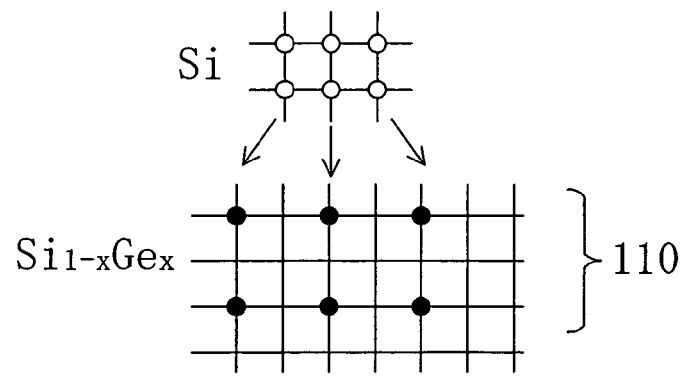
FIGS. 11B and 11C are diagrams schematically showing processes of the growth of a strained silicon layer in the MIS transistor according to the third embodiment of the present invention.
Figure 11C:
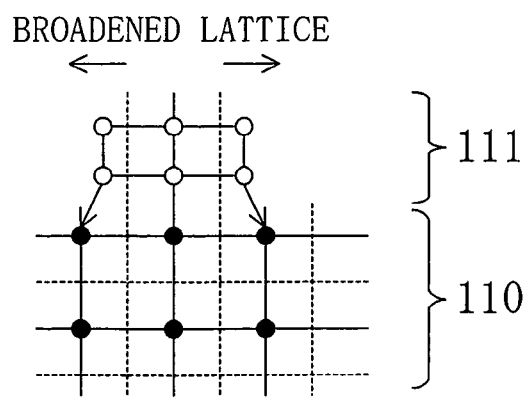

As shown in FIG. 11B, when silicon (Si) is epitaxially grown on the buffer layer 110 having a larger lattice constant than silicon, the lattice constant of the resultant strained silicon layer 111 becomes larger (strained) than that of a normal silicon as shown in FIG. 11C, resulting in a strained crystal structure. The strained silicon layer 111 is thus provided in the channel region of the transistor, which decreases the resistances of electrons and holes contained in the region and enhances the mobilities of the electrons and the holes. Therefore, the operation properties of the transistor are improved.

Note that the buffer layer 110 and the strained silicon layer 111 may be grown not on the main surface of the p-type semiconductor substrate 100 but on the main surface of an SOI substrate.

Fourth Embodiment

Next description will be made of a semiconductor device having a raised source and drain (raised-s/d) structure according to a fourth embodiment of the present invention, as well as a method for fabricating the same.

Figure 12A:
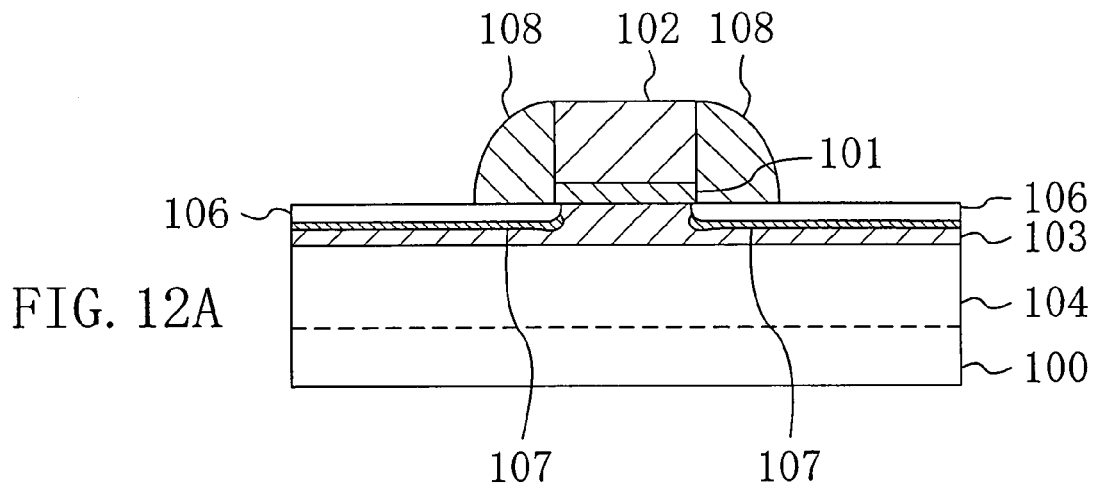
FIGS. 12A through 12C are sectional views showing process steps of a fabricating method of a MIS transistor according to a fourth embodiment of the present invention step by step.
Figure 12B:
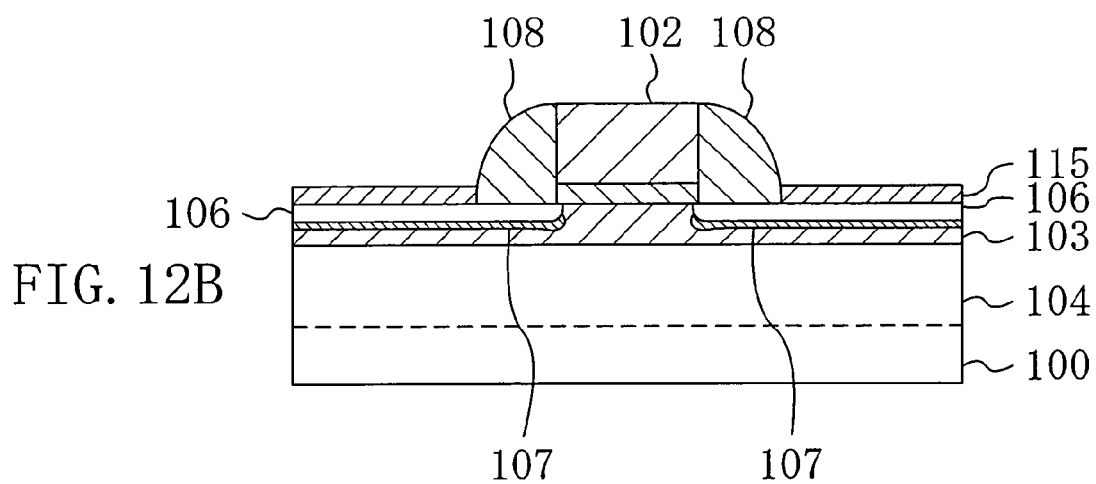
Figure 12C:
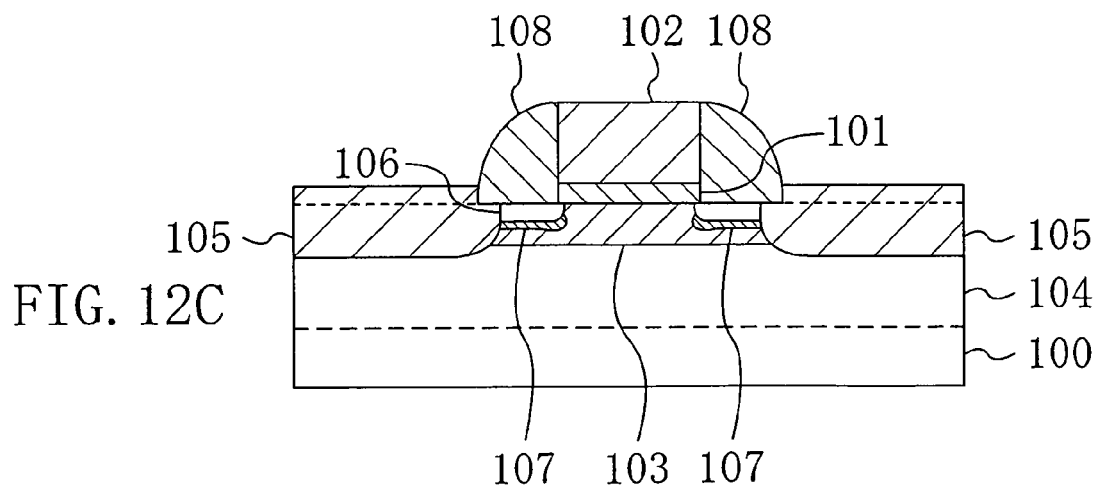
Figure 13A:
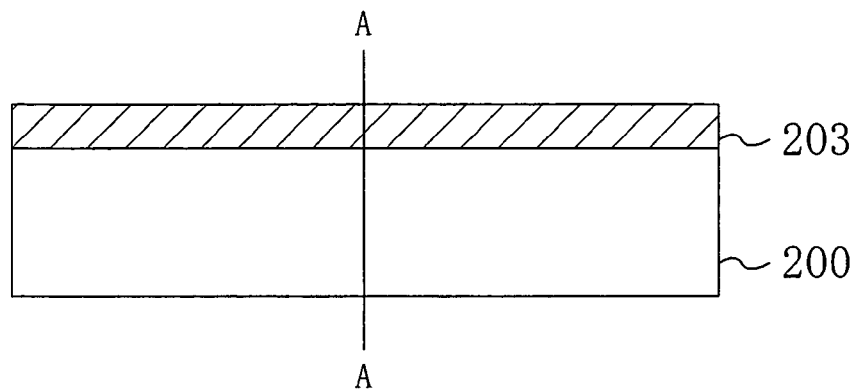
FIGS. 13A through 13C are sectional views showing process steps of a conventional fabricating method of a MIS transistor step by step.
Figure 13B:
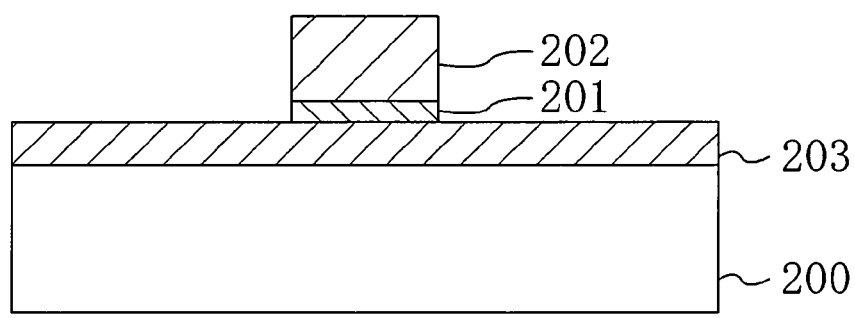
Figure 13C:
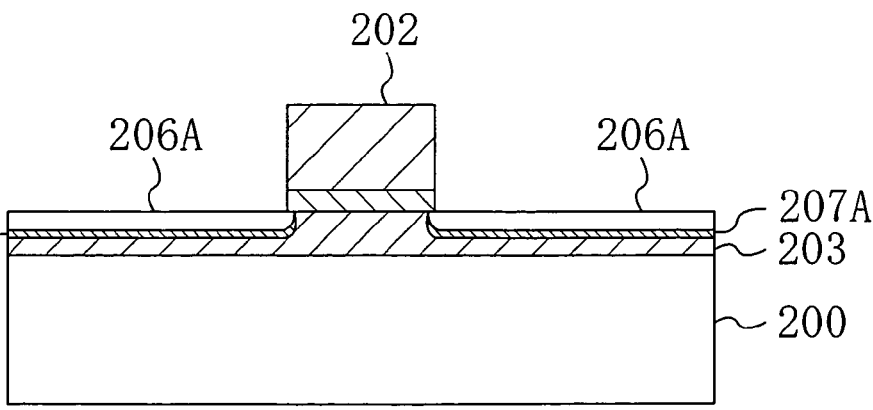
Figure 14A:
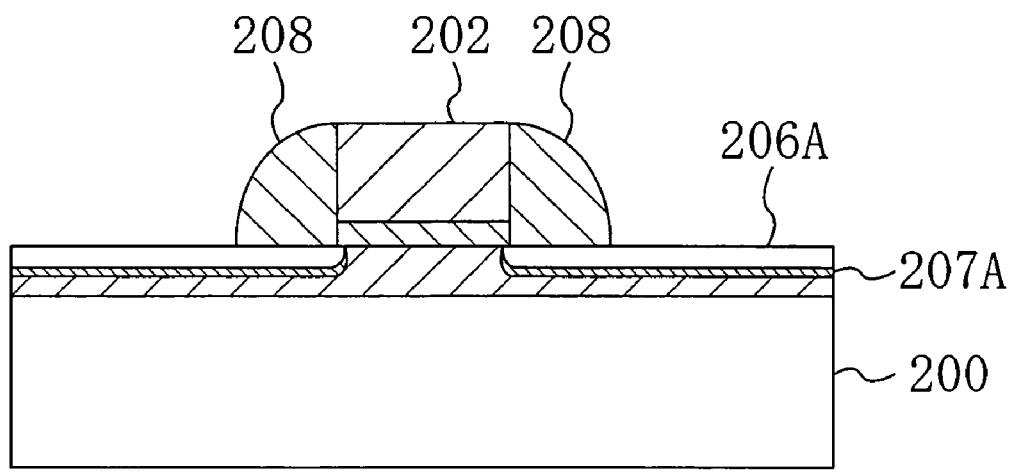
FIGS. 14A and 14B are sectional views showing process steps of the conventional fabricating method of a MIS transistor step by step.
Figure 14B:
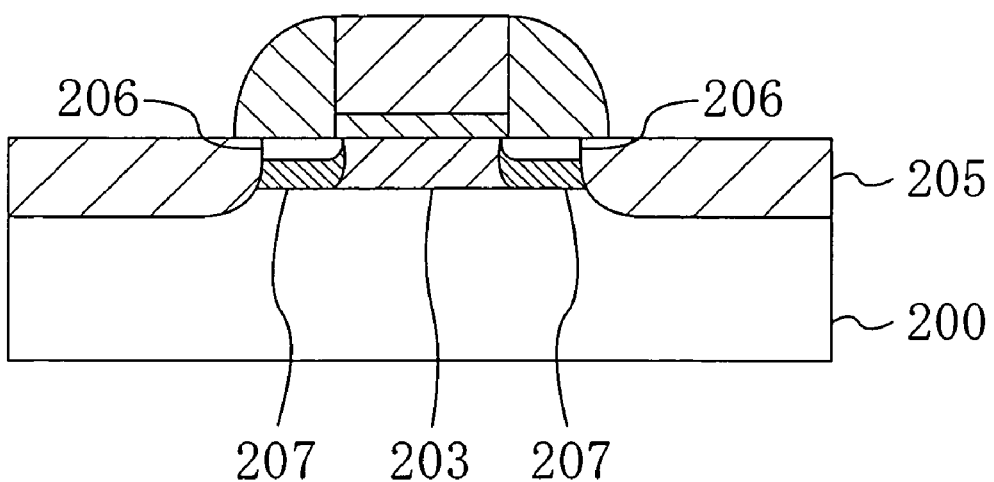
Figure 15:
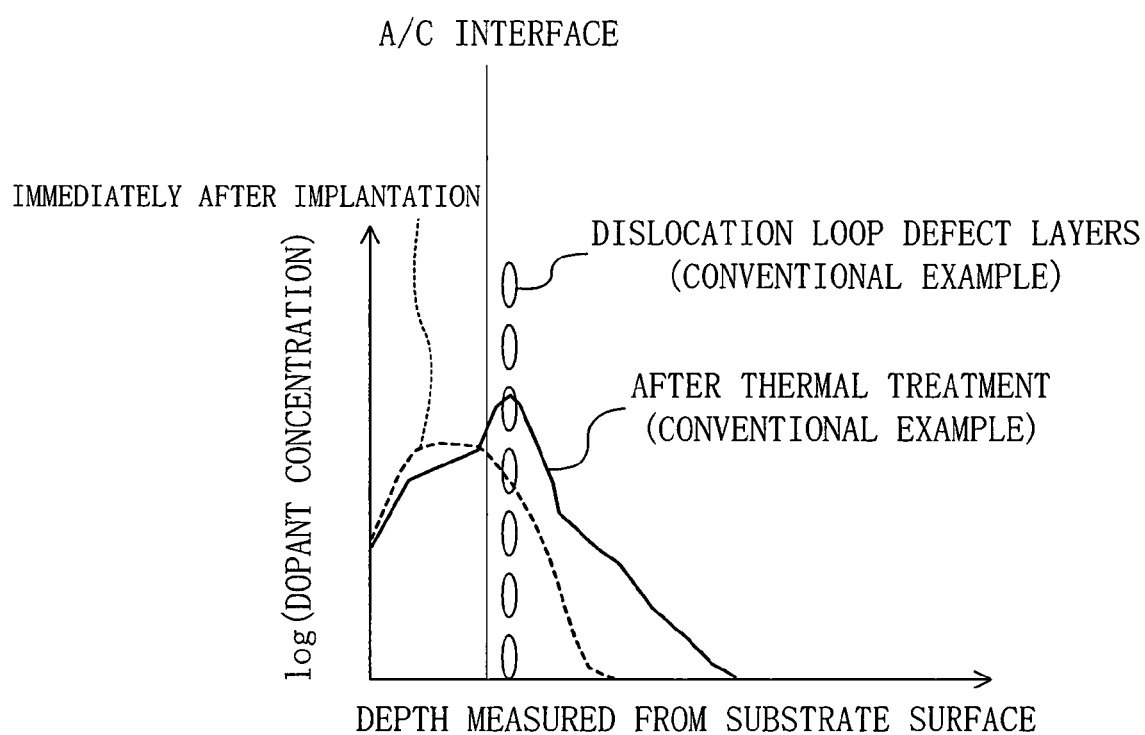
FIG. 15 is a graph showing the relation between the depth measured from the substrate surface and the dopant concentration, which is obtained after the formation of a diffused channel layer in the conventional MIS transistor.

FIGS. 12A to 12C are sectional views showing process steps of the fabricating method of a MIS transistor according to the fourth embodiment of the present invention step by step. The description of the components shown in FIGS. 12A to 12C that are the same as those shown in FIGS. 2 to 4 will be omitted by retaining the same reference numerals.

First, as shown in FIG. 12A, a p-diffused channel layer 103 and a Ge-containing layer 104 are formed in the upper portion of a semiconductor substrate 100 by the same condition as the fabricating method of a MIS transistor according to the first embodiment. Like the first embodiment, a gate insulating film 101 and a gate electrode 102 are formed above the main surface of the semiconductor surface 100. Using the gate electrode 102 as a mask, heavily n-diffused extension layers 106 are formed in relatively shallow regions of the semiconductor substrate 100 and p-diffused pocket layers 107 are formed under the shallow regions. Sidewalls 108 are then formed on the side surfaces of the gate electrode 102.

As shown in FIG. 12B, by ultra-high vacuum chemical vapor deposition (UHV-CVD) or the like, epitaxial silicon layers 115 having a thickness of about 5 to 100 nm, preferably about 35 nm, are selectively grown on the exposed regions of the main surface of the semiconductor substrate 100.

As shown in FIG. 12C, using the gate electrode 102 and the sidewalls 108 as a mask, arsenic ions acting as an n-type dopant are implanted into the epitaxial silicon layers 115 and the semiconductor substrate 100 underlying the layers at an implantation energy of about 30 keV and a dose of about $3 \times 10^{15}/cm^2$. The resulting semiconductor substrate 100 is heated to about 850 to 1050° C. at a heating rate of about 200 to 250° C./sec, after which rapid thermal annealing (RTA) is performed either with the peak temperature thereof kept for about 10 seconds at the maximum or with the peak temperature not kept. This RTA diffuses the arsenic ions into portions of the epitaxial silicon layers 115 and the semiconductor substrate 100 which are located at either side of the sidewalls 108, thereby forming heavily n-diffused layers 105 which are in contact with the heavily n-diffused extension layers 106, respectively, and which have relatively deep junction interfaces as compared to the layers 106.

Note that the MIS transistor according to the fourth embodiment may be fabricated by the fabricating method of the second embodiment.

Also in the fourth embodiment, as the semiconductor substrate 100, use may be made of a silicon substrate whose plane orientation is the {110} plane or an epitaxial substrate in which an epitaxial layer or a strained silicon layer is provided on the surface of a normal semiconductor substrate, instead of a silicon substrate whose plane orientation is the {100} plane that is in common use.

In the embodiments described above, the sidewalls 108 are formed directly on the side surfaces of the gate electrode 102. Alternatively, an offset spacer of silicon oxide to be used for a mask for extension implantation may be formed between the gate electrode 102 and each of the side walls 108.

The film used for the sidewalls 108 is not limited to a single-layer film. Alternatively, a multilayer film may be employed which is made of a silicon oxide film having an L-shaped section and a silicon nitride film formed on the silicon oxide film.

In the embodiments described above, as the thermal treatment, the rapid thermal annealing is employed either with the peak temperature of the treatment kept for 10 seconds at the maximum or with the peak temperature not kept. Alternatively, flash lamp annealing or laser annealing may be employed which is capable of performing a thermal treatment for a short time.

What is claimed is:

1. A method for fabricating a semiconductor device, comprising:
    a first step implanting, into a channel formation region of a semiconductor substrate, first dopant ions of a first conductivity type which are indium ions to form a dopant implantation layer in the channel formation region;
    a second step of implanting second dopant ions into the semiconductor substrate to form a first amorphous layer;
    after the first and second steps, a third step of performing a first thermal treatment to diffuse the first dopant ions from the dopant implantation layer, thereby forming a first diffused layer of the first conductivity type in the channel formation region; and
    after the third step, a fourth step of selectively forming a gate insulating film on the semiconductor substrate and a gate electrode on the gate insulating film,
    wherein the first amorphous layer expands from the substrate surface to a region of the substrate deeper than the dopant implantation layer.

2. The method of claim 1, wherein the semiconductor substrate is made of silicon, and the second dopant ion belongs to group IV elements.

3. The method of claim 2, wherein the plane orientation of the semiconductor substrate is the {100} plane.

4. The method of claim 2, wherein the semiconductor substrate includes, in the upper portion thereof, an epitaxial layer formed by epitaxially growing silicon.

5. The method of claim 2, wherein the semiconductor substrate includes, in the upper portion thereof, a strained silicon layer having a crystal lattice of a larger lattice constant than a normal lattice constant.

6. The method of claim 1, wherein the dose of the indium ions to be implanted is $5 \times 10^{13}/cm^2$ or more.

7. The method of claim 1, further comprising, after the fourth step,
    a fifth step of implanting third dopant ions of a second conductivity type into the semiconductor substrate using the gate electrode as a mask, and
    a sixth step of performing a second thermal treatment on the semiconductor substrate to diffuse the third dopant ions, thereby forming a second diffused layer of the second conductivity type.

8. The method of claim 1, wherein the first thermal treatment is rapid thermal annealing performed at a heating rate of about 100° C./sec or higher, at a heating temperature of 850 to 1050° C., and either with the peak temperature of the treatment kept for 10 seconds at the maximum or with the peak temperature not kept.

9. The method of claim 1, further comprising, after the first and second steps and before the third step, the step of performing a third thermal treatment at such a temperature that the first dopant ions do not diffuse from the dopant implantation layer and that the crystallinity of the amorphous layer is restored, thereby recovering crystal damages caused by the first dopant ions.

10. The method of claim 9, wherein the heating temperature if the third thermal treatment is 400 to 600° C.

11. The method of claim 10, wherein the heating time of the third thermal treatment is 1 to 20 hours.

12. The method of claim 7, further comprising, between the fourth and sixth steps, the step of implanting fourth dopant ions of the first conductivity type into the semiconductor substrate using the gate electrode as a mask,
wherein the second thermal treatment performed in the sixth step diffuses the fourth dopant ions, thereby forming a third diffused layer of the first conductivity type below the second diffused layer.

13. The method of claim 7, further comprising, after the sixth step,
the step of forming sidewalls of an insulating film on the side surfaces of the gate electrode, and
the step of implanting fifth dopant ions of the second conductivity type into the semiconductor substrate using the gate electrode and the sidewalls as a mask and then performing a fourth thermal treatment to diffuse the fifth dopant ions, thereby forming, outside the second diffused layer, a fourth diffuse layer of the second conductivity type which has a deeper junction interface than the second diffused layer.

14. The method of claim 7, wherein the second step is performed after the first step.

15. The method of claim 1,
wherein the second dopant ions is germaniums ions.

16. The method of claim 1,
wherein in the first step, the implantation of the first dopant ions containing indium ions forms, on the semiconductor substrate, a second amorphous layer which is shallower than the first amorphous layer.

17. The method of claim 1,
wherein in the first step, the implantation of the first dopant ions containing indium ions forms an amorphous-crystal interface immediately below the region of the semiconductor substrate at which a dopant concentration of indium reaches the peak.

18. The method of claim 17,
wherein the second dopant ions is germanium ions, and
in the second step, the implantation of germanium ions transfers the amorphous-crystal interface to the position in the semiconductor substrate deeper than the peak position of the dopant concentration of germanium.

19. The method of claim 1,
wherein the first diffused layer is a diffused channel layer.

20. The method of claim 1,
wherein the first thermal treatment in the third step restores the amorphous layer to a crystal layer.

21. The method of claim 1,
wherein the second dopant ions is germanium ions,
the first diffused layer is a diffused channel layer, and
in the fourth step, an interface between the gate insulating film and the semiconductor substrate has a higher dopant concentration of germanium than a below side of the channel diffused layer.

22. The method of claim 1,
wherein the second dopant ions is germanium ions,
the first diffused layer is a diffused channel layer, and
in the fourth step, a dopant concentration of germanium contained in an interface between the gate insulating film and the semiconductor substrate is about $5 \times 10^{18}$ to $5 \times 10^{21}$ atoms/cm$^3$ and the dopant concentration of germanium contained in the deeper side of the diffused channel layer is about $1 \times 10^{15}$ to $1 \times 10^{17}$ atoms/cm$^3$.

23. The method of claim 1,
wherein the second dopant ions is germanium ions,
the first diffused layer is a diffused channel layer, and
in the fourth step, a region of the diffused channel layer slightly deeper than a surface of the semiconductor substrate has a higher dopant concentration of indium than the surface of the semiconductor substrate.

24. The method of claim 1,
wherein the first thermal treatment is performed using laser annealing.

25. The method of claim 1,
wherein the first thermal treatment is performed using flash annealing.

26. The method of claim 1,
wherein the first step is performed after the second step.

27. The method of claim 1,
wherein the first step is performed after the second step, and
the first thermal treatment is performed using laser annealing.

28. The method of claim 1,
wherein the second dopant ions is germanium ions,
the first thermal treatment is performed using laser annealing.

29. The method of claim 1,
wherein the first step is performed after the second step,
the second dopant ions is germanium ions, and
the first thermal treatment is performed using laser annealing.

30. The method of claim 1,
wherein the first step is performed after the second step,
the second dopant ions is germanium ions, and
the first thermal treatment is performed using flash annealing.

31. The method of claim 1,
wherein after the first and second steps and before the third step, a third thermal treatment is performed at a temperature of 400 to 600° C. to the semiconductor substrate,
the second dopant ions is germanium ions, and
the first thermal treatment is performed using laser annealing.

32. The method of claim 1,
wherein the first step is performed after the second step,
after the first step and before the third step, a fifth thermal treatment is performed at a temperature of 400 to 600° C. to the semiconductor substrate,
the second dopant ions is germanium ions, and
the first thermal treatment is performed using laser annealing.

33. The method of claim 1,
wherein after the first and second steps and before the third step, a third thermal treatment is performed at a temperature of 400 to 600° C. to the semiconductor substrate,
the second dopant ions is germanium ions, and
the first thermal treatment is performed using flash annealing.

* * * * *